(12) United States Patent
Fujikura (10) Patent No.: US 9,812,607 B2
(45) Date of Patent: Nov. 7, 2017

(54) METHOD FOR MANUFACTURING NITRIDE SEMICONDUCTOR TEMPLATE

(71) Applicant: SUMITOMO CHEMICAL COMPANY, LIMITED, Tokyo (JP)

(72) Inventor: Hajime Fujikura, Hitachi (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 0 days.

(21) Appl. No.: 15/511,909

(22) PCT Filed: Jul. 8, 2015

(86) PCT No.: PCT/JP2015/069589
§ 371 (c)(1),
(2) Date: Mar. 16, 2017

(87) PCT Pub. No.: WO2016/042891
PCT Pub. Date: Mar. 24, 2016

(65) Prior Publication Data
US 2017/0263807 A1    Sep. 14, 2017

(30) Foreign Application Priority Data
Sep. 17, 2014 (JP) .................................. 2014-188710

(51) Int. Cl.
*H01L 21/00* (2006.01)
*H01L 33/00* (2010.01)
(Continued)

(52) U.S. Cl.
CPC ............ *H01L 33/007* (2013.01); *C23C 16/34* (2013.01); *H01L 21/0254* (2013.01);
(Continued)

(58) Field of Classification Search
CPC ................ H01L 21/0254; H01L 21/02458; H01L 33/12
See application file for complete search history.

(56) References Cited

U.S. PATENT DOCUMENTS

2003/0189218 A1  10/2003  Watanabe et al.
2004/0113166 A1   6/2004  Tadatomo et al.
(Continued)

FOREIGN PATENT DOCUMENTS

JP   10-32349 A    2/1998
JP   2002-84000 A  3/2002
(Continued)

OTHER PUBLICATIONS

International Search Report for PCT/JP2015/069569 (PCT/ISA/210) dated Sep. 15, 2015.
(Continued)

*Primary Examiner* — Ngan Ngo
(74) *Attorney, Agent, or Firm* — Birch, Stewart, Kolasch & Birch, LLP (57) ABSTRACT

There is provided a method for manufacturing a nitride semiconductor template, including the steps of: growing and forming a buffer layer in a thickness of not more than a peak width of a projection and in a thickness of not less than 10 nm and not more than 330 nm on a sapphire substrate formed by arranging conical or pyramidal projections on its surface in a lattice pattern; and growing and forming a nitride semiconductor layer on the buffer layer.

5 Claims, 7 Drawing Sheets

(51) Int. Cl.
*C23C 16/34* (2006.01)
*H01L 33/12* (2010.01)
*H01L 33/20* (2010.01)
*H01L 33/32* (2010.01)
*H01L 21/02* (2006.01)

(52) U.S. Cl.
CPC ........ *H01L 21/02458* (2013.01); *H01L 33/12* (2013.01); *H01L 33/20* (2013.01); *H01L 33/32* (2013.01)

(56) References Cited

U.S. PATENT DOCUMENTS

| | | | | |
|---|---|---|---|---|
| 2005/0042789 | A1* | 2/2005 | Fujikura | C30B 25/02 438/47 |
| 2006/0273336 | A1* | 12/2006 | Fujikura | H01L 33/42 257/98 |
| 2011/0204411 | A1 | 8/2011 | Nago et al. | |
| 2012/0112188 | A1* | 5/2012 | Yokoyama | H01L 21/0242 257/51 |
| 2012/0298952 | A1 | 11/2012 | Hikosaka et al. | |
| 2013/0037779 | A1* | 2/2013 | Takeoka | H01L 33/025 257/13 |
| 2014/0264415 | A1* | 9/2014 | Okuno | H01L 33/22 257/98 |
| 2014/0312004 | A1* | 10/2014 | Suzuki | H01L 33/007 216/48 |
| 2015/0311388 | A1* | 10/2015 | Shimooka | H01L 33/007 257/615 |
| 2016/0005923 | A1* | 1/2016 | Suzuki | H01L 33/20 257/98 |
| 2016/0005935 | A1* | 1/2016 | Liao | H01L 33/508 257/98 |
| 2016/0043274 | A1* | 2/2016 | Kanto | H01L 33/46 257/98 |
| 2016/0111599 | A1* | 4/2016 | Ohya | H01L 33/10 257/98 |
| 2016/0149076 | A1* | 5/2016 | Kitano | H01L 33/10 257/98 |

FOREIGN PATENT DOCUMENTS

| | | |
|---|---|---|
| JP | 2002-280611 A | 9/2002 |
| JP | 2002-374002 A | 12/2002 |
| JP | 2010-161354 A | 7/2010 |
| JP | 2011-176130 A | 9/2011 |
| JP | 2012-104564 A | 5/2012 |
| JP | 2012-244092 A | 12/2012 |

OTHER PUBLICATIONS

English translations of the International Preliminary Report on Patentability and Written Opinion of the International Searching Authority (forms PCT/IB/373, PCT/ISA/237 and PCT/IB/338), dated Mar. 30, 2017, for International Application No. PCT/JP2015/069589.

\* cited by examiner

METHOD FOR MANUFACTURING NITRIDE SEMICONDUCTOR TEMPLATE

TECHNICAL FIELD

The present invention relates to a method for manufacturing a nitride semiconductor template.

DESCRIPTION OF RELATED ART

For example, a nitride semiconductor light-emitting element such as a light-emitting diode (LED) (hereinafter also simply referred to as a "light-emitting element") is constituted by forming a light-emitting structure on a nitride semiconductor template. An n-type semiconductor layer composed of for example gallium nitride (GaN), etc., a light-emitting layer, and a p-type semiconductor layer are grown and formed on the nitride semiconductor template in this order as the light-emitting structure. The nitride semiconductor template is formed by, for example growing a buffer layer and a nitride semiconductor layer in this order on a sapphire substrate. In such a light-emitting element, an important subject is how efficiently a light generated in the light-emitting layer can be extracted. Namely, it is important to improve a light extraction efficiency (light emission output) of the light-emitting element.

Therefore, in order to improve the light extraction efficiency of the light-emitting element, a PSS substrate (Patterned Sapphire Substrate) which is subjected to uneven processing for forming conical or polygonal conical projections on an upper surface of a substrate is proposed (for example see patent document 1). Then, the buffer layer having a predetermined thickness is grown and formed on the PSS substrate, and the nitride semiconductor layer such as a GaN layer is grown and formed on the buffer layer until the surface becomes flat, to thereby form the nitride semiconductor template. The light-emitting element formed by growing the light-emitting layer, etc., on the nitride semiconductor template using the PSS substrate subjected to such uneven processing, can reduce a confinement of light inside of the light-emitting element, and improve the light extraction efficiency of the light-emitting element.

Further, when the PSS substrate subjected to such uneven processing is used as the substrate of the nitride semiconductor template, by promoting an island-like growth of the nitride semiconductor layer at an initial stage of a growth of the nitride semiconductor layer when the nitride semiconductor layer such as GaN layer is grown on the substrate, an association of dislocations in a crystal of the nitride semiconductor layer can be increased, and disappearance of the dislocations can be increased. Therefore, as compared with a case of using a flat sapphire substrate (hereinafter also referred to as a flat substrate) which is not subjected to uneven processing, the nitride semiconductor layer with less dislocations in the crystal can be formed. Namely, when the sapphire substrate subjected to uneven processing is used, crystallinity of the nitride semiconductor layer can be improved.

PRIOR ART DOCUMENT

Patent Document

Patent Document 1: Japanese Patent Publication Laid Open Publication No. 2002-280611

SUMMARY OF THE INVENTION

Problem to be Solved by the Invention

However, when the sapphire substrate subjected to uneven processing is used as the substrate of the nitride semiconductor template, surface pits which may obstruct device operation are likely to occur as compared with a case of using the flat substrate.

Figure 6:
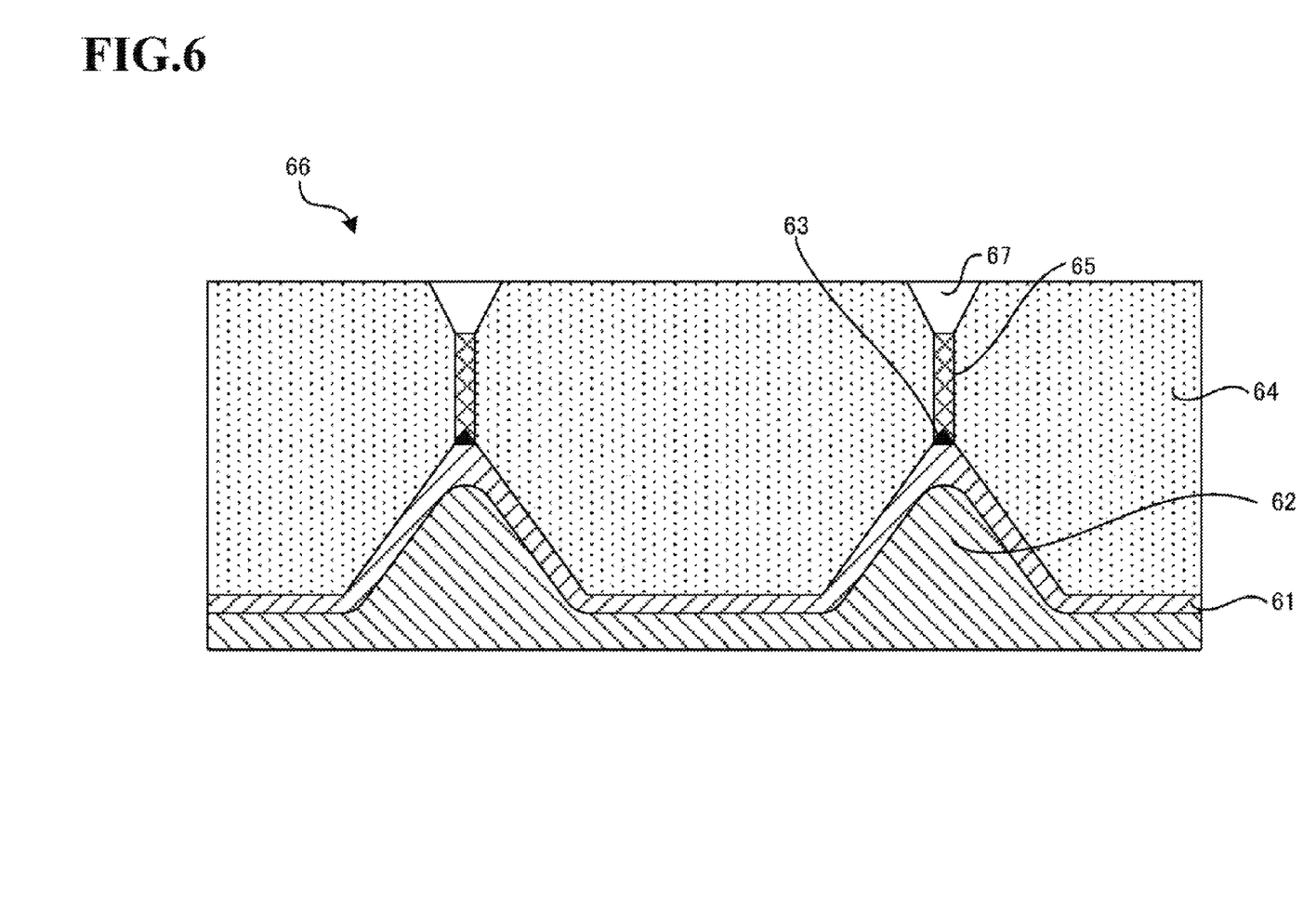
FIG. 6 is a schematic cross-sectional view showing a part of a conventional nitride semiconductor template in an enlarged manner.

Namely, a curvature radius of the projection near the peak of, for example the conical projection of the sapphire substrate is smaller than the other portions. Therefore, a large number of atomic steps exist on the peak or near the peak of the projection. When the buffer layer is grown on the substrate on which the projections are formed, in an initial stage of a growth of the buffer layer, a large number of atomic steps remain in the buffer layer grown on the peak or near the peak of the projection of the substrate. Accordingly, a growth rate of the buffer layer on the peak or near the peak of the projection is likely to be faster than the other portions until the growth of the buffer layer progresses and the surface of the buffer layer becomes smooth (becomes a crystal plane free from atomic steps). Therefore, as the growth of the buffer layer progresses and the buffer layer becomes thicker, for example as shown in FIG. 6, the buffer layer 61 is sometimes formed into a sharp pointed shape at the peak of the projection 62 of the sapphire substrate. When the buffer layer 61 is formed into a sharp pointed shape at the peak of the projection 62, a surface energy increases and a growth condition of the buffer layer 61 is modulated, near the peak of the projection. Therefore, an inversion domain (ID) 63 in which polarity is reversed, is easily generated in the buffer layer 61, near the peak of the projection 62. When the ID 63 exists in the buffer layer 61, ID 65 is also generated in the nitride semiconductor layer 64 grown on the ID 63 of the buffer layer 61 when the nitride semiconductor layer 64 is grown on the buffer layer 61. The growth rate of the N-polar ID 65 is slower than the growth rate of the nitride semiconductor layer 64 of the group III polarity (such as Ga polarity) free from ID, and pits 67 occur in an upper part of the ID 65. Accordingly, pits 67 remain on the surface of the nitride semiconductor layer 64, that is, on the surface of the nitride semiconductor template 66 even when the nitride semiconductor layer 64 is grown thick.

Therefore, in order to solve the abovementioned problem, an object of the present invention to provide a method for manufacturing a nitride semiconductor template capable of suppressing occurrence of surface pits.

Means for Solving the Problem

In order to solve the abovementioned problem, the present invention is constituted as follows.

According to a first aspect of the present invention, there is provided a method for manufacturing a nitride semiconductor template, including the steps of:

growing and forming a buffer layer in a thickness of not more than a peak width of a projection and in a thickness of not less than 10 nm and not more than 330 nm on a sapphire substrate formed by arranging conical or pyramidal projections on its surface in a lattice pattern; and growing and forming a nitride semiconductor layer on the buffer layer.

According to a second aspect of the present invention, there is provided the method for manufacturing a nitride semiconductor template of the first aspect, wherein in the step of growing and forming the buffer layer, a GaN layer or an AlN layer is grown as the buffer layer at a temperature of 600° C. or less.

According to a third aspect of the present invention, there is provided the method for manufacturing a nitride semiconductor template of the first aspect, wherein in the step of growing and forming the buffer layer, an AlN layer is grown as the buffer layer at a temperature of 1000° C. or more.

According to a fourth aspect of the present invention, there is provided the method for manufacturing a nitride semiconductor template of any one of the first to third aspects, wherein in the step of growing and forming the nitride semiconductor layer, any one of a GaN layer, an AlGaN layer, and an InAlGaN layer is grown as the nitride semiconductor layer.

According to a fifth aspect of the present invention, there is provided the method for manufacturing a nitride semiconductor template of any one of the first to fourth aspects, wherein the buffer layer and the nitride semiconductor layer are grown by a HVPE method or a MOVPE method.

Advantage of the Invention

According to the method for manufacturing a nitride semiconductor template of the present invention, occurrence of the surface pits can be suppressed.

DETAILED DESCRIPTION OF THE INVENTION

Hereinafter, a nitride semiconductor template and a semiconductor light-emitting element using the nitride semiconductor template according to an embodiment of the present invention will be described.

(1) Nitride Semiconductor Template

First, the nitride semiconductor template according to this embodiment will be described mainly with reference to FIGS. 1 and 2.

Figure 1:
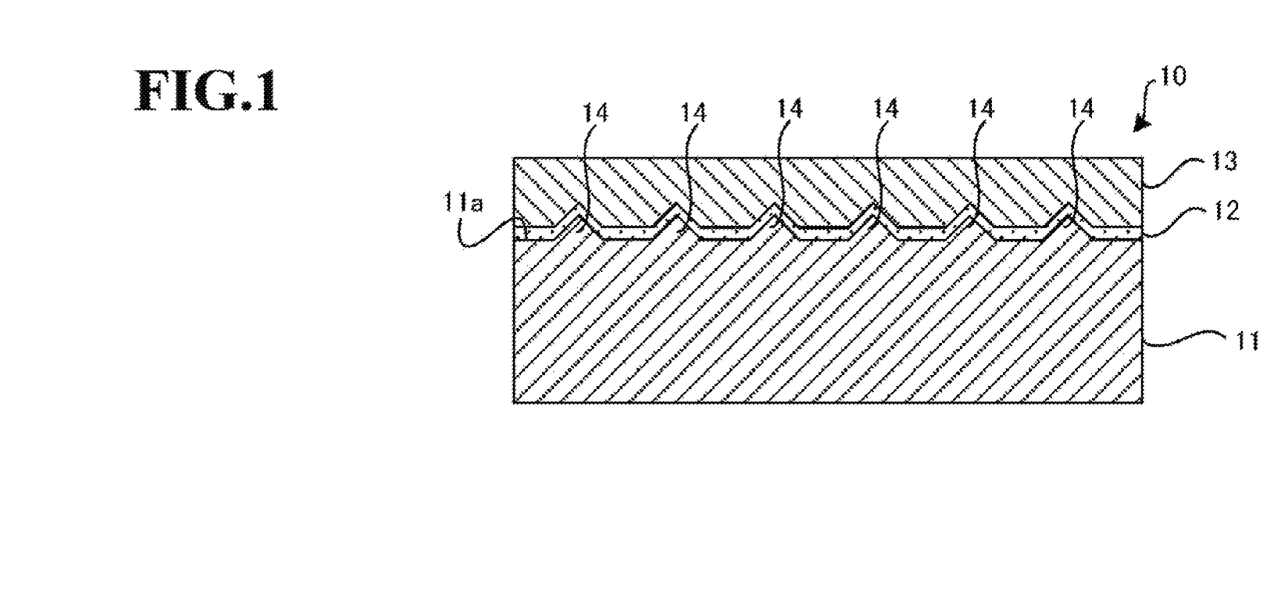
FIG. 1 is a schematic cross-sectional view of a nitride semiconductor template according to an embodiment of the present invention.

As shown in FIG. 1, a nitride semiconductor template 10 according to this embodiment is formed by growing a buffer layer 12 and a nitride semiconductor layer 13 in this order on a sapphire substrate 11.

Figure 2:
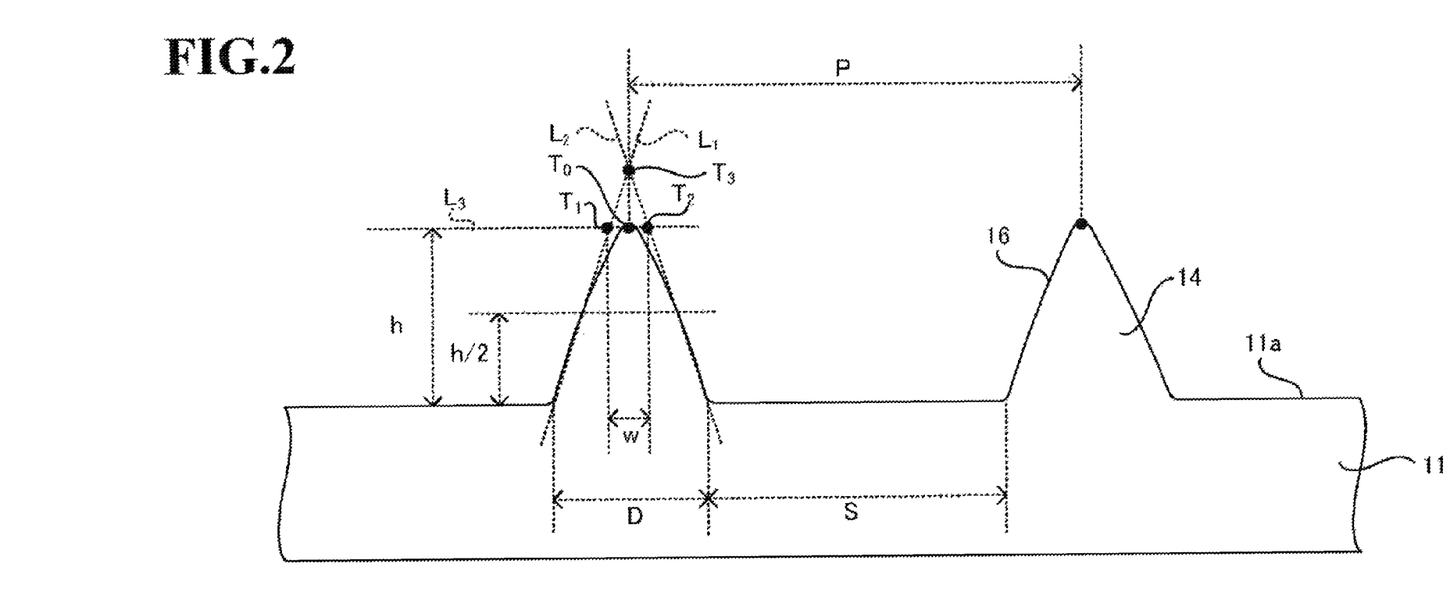
FIG. 2 is a schematic view showing a method for calculating a peak width of a projection formed on a sapphire substrate according to an embodiment of the present invention.

As shown in FIG. 1 and FIG. 2, the sapphire substrate 11 has conical or pyramidal (triangular pyramidal, quadrangular pyramidal, hexagonal pyramidal, etc.) projections 14 formed on its surface (main surface) 11a which is a growth plane for growing a nitride semiconductor thereon. The projections 14 are formed in a grid pattern (triangular lattice pattern, square lattice pattern, etc.) on the surface 11a of the sapphire substrate 11. The surface 11a of the sapphire substrate 11 is preferably a C-plane. For example, the projections 14 are formed on the surface of a flat sapphire substrate by photolithography and dry-etching.

As shown in FIG. 2, height h of each projection 14 from the surface 11a to the peak of the projection 14 is preferably set to not less than 0.3 μm and not more than 3 μm, width D of the bottom portion of the projection 14 is preferably set to not less than 0.3 μm and not more than 4 μm, distance S between the bottom portions of the adjacent projections 14 is preferably set to not less than 0.1 μm and not more than 2 μm and pitch P between adjacent projections 14, 14 is preferably set to not less than 0.4 μm and not more than 6 μm. Further, peak width w of the conical or pyramidal projection 14 is preferably set to not less than 0.01 μm and not more than 0.33 μm.

A commercially available PSS substrate (Patterned Sapphire Substrate) may be used as the sapphire substrate 11 on which the projections 14 are formed. Further, the sapphire substrate 11 may be a circular substrate having substantially a circular shape when viewed from the top, a rectangular substrate, or the like.

By using the sapphire substrate 11 on which the conical or pyramidal projections 14 are formed in a lattice pattern as described above, an island-like growth of the nitride semiconductor layer 13 can be promoted when the nitride semiconductor layer 13 is grown on the sapphire substrate 11, disappearance due to the association of dislocations in the crystal of the nitride semiconductor layer 13 can be increased, and a dislocation of the nitride semiconductor layer 13 can be reduced. Further, when a light-emitting element such as a blue light-emitting diode (blue LED) is formed using the nitride semiconductor template 10, the light extraction efficiency of the light-emitting element can be improved.

For example, a gallium nitride (GaN) layer, an aluminum nitride (AlN) layer or the like is grown and formed at a low growth temperature of 600° C. or less, as the buffer layer 12 on the sapphire substrate 11 on which the projections 14 are formed. The buffer layer 12 may be an AlN layer, etc., grown at a high growth temperature of, for example 1000° C. or more.

The buffer layer 12 is formed in a thickness of not more than the peak width w of the projection 14, and in a thickness of not less than 10 nm and not more than 330 nm. The peak width w of the projection 14 is a length related to, or associated with a curvature radius of the peak portion of the projection 14, and defines the shape of the buffer layer 12 gradually growing in the upper part of the peak portion of the projection 14. Preferably, a thickness of the buffer layer 12 is set as a thickness of the buffer layer 12 in the upper part of the peak portion of the projection 14, or as a thickness of the buffer layer 12 on the surface 11a of the sapphire substrate 11 on which the projections 14 are not formed.

When it is difficult to measure and manage an actual thickness of the buffer layer 12, that is, the thickness at the abovementioned parts, etc., formation and management of the thickness of the buffer layer 12 may be performed by the following simple method. Namely, the growth condition (for example, a predetermined gas supply flow rate and growth time, etc.) is calculated as follows: the thickness of the buffer layer (hereinafter also referred to as "a flat buffer layer") formed on a flat sapphire substrate (hereinafter also referred to as "flat substrate") on which the projections 14 are not formed, is not more than the peak width w of the projection 14, and not less than 10 nm and not more than 330 nm. Then, under the same growth condition as this growth condition, the buffer layer 12 is grown and formed on the sapphire substrate 11 on which the projections 14 of this embodiment are formed. In this case, the growth condition may be adjusted in consideration of a difference in a growth rate between the flat buffer layer grown on the flat sapphire substrate and the buffer layer 12 grown on the sapphire substrate 11 on which the projections 14 are formed.

By setting the thickness of the buffer layer 12 as described above, occurrence of the surface pits of the nitride semiconductor layer 13 can be suppressed and crystallinity can be improved. Namely, by setting the thickness of the buffer layer 12 to be not more than the peak width w of the projection 14, or by growing and forming the buffer layer 12 under the growth condition such that the thickness of the flat buffer layer is not more than the peak width w of the projection 14, the following situation can be suppressed: the buffer layer 12 is formed to be thicker at the peak portion of the projection 14 than other portions, and the buffer layer 12 is formed into a sharp pointed shape at the peak portion of the projection 14. Thereby, it is possible to suppress the generation of the inversion domain (ID) in the buffer layer 12 at a position located on the peak or near the peak of the projection 14. Therefore, it is possible to suppress the generation of ID in the nitride semiconductor layer 13 in the upper part of the peak or near the peak of the projection 14. As a result, it is possible to suppress the occurrence of the pits, which obstruct a device operation, on the surface of the nitride semiconductor template 10, that is, on the surface of the nitride semiconductor layer 13.

When the buffer layer 12 is formed in a thickness of less than 10 nm, or when the flat buffer layer is grown and formed under the growth condition such that the thickness of the flat buffer layer is less than 10 nm, coverage of the surface of the sapphire substrate 11 by the buffer layer 12 is lowered, and therefore the effect of suppressing the occurrence of the surface pits cannot be exhibited. On the other hand, even when the thickness of the buffer layer 12 is not more than the peak width w of the projection 14, a crystal quality of the buffer layer 12 itself is deteriorated when the buffer layer 12 is formed in a thickness exceeding 330 nm, or when the flat buffer layer is grown and formed under the growth condition such that the thickness of the flat buffer layer exceeds 330 nm. Therefore, the generation of ID of the buffer layer 12 cannot be suppressed, and the occurrence of the surface pits in the nitride semiconductor template 10 cannot be suppressed. Accordingly, the thickness of the buffer layer 12 is set to be not less than 10 nm and not more than 330 nm.

Here, the peak width w of the projection 14 is defined as follows. Namely, as shown in FIG. 2, a length of the base $T_1T_2$ of a triangle $T_1T_2T_3$ is defined as the peak width w of the projection 14, the triangle $T_1T_2T_3$ being formed by two tangent lines $L_1$ and $L_2$ (the tangent lines $L_1$ and $L_2$ intersect at a point $T_3$) at a position (h/2) which is half of the height h of the projection 14 on an outline 16 of the measured projection 14 on the surface of the sapphire substrate 11 (a contour line of a vertical cross-section including a top point of the projection 14), and a parallel line $L_3$ in contact with top point $T_0$ of the outline 16 of the projection 14 and parallel to the surface 11a of the sapphire substrate 11 on which the projections 14 are not formed.

Figure 3:
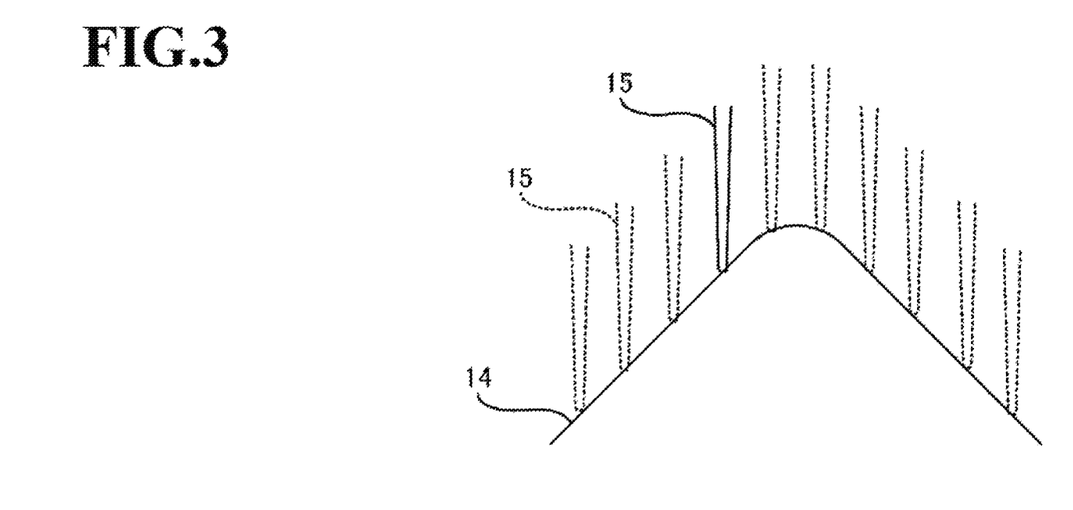
FIG. 3 is a schematic view showing a state of measuring a shape of the projection formed on the sapphire substrate by AFM measurement according to an embodiment of the present invention.

As shown in FIG. 3, using a sharpened probe 15, the outline 16 of the projection 14 is measured by moving the probe 15 along the projection 14 using an atomic force microscope (AFM). The shape (outline 16) of the projection 14 is measured, for example by reading position information of a tip of the probe 15 at a plurality of locations on one projection 14 and by plotting each information. For the measurement of the outline 16 of the projection 14, for example it is preferable to use a probe made of silicon or the like whose tip is sharpened by etching so as to have a curvature radius of about 10 nm, or a probe made of a carbon nanotube having a diameter of about 1 nm, as the probe 15. Thereby, even when the curvature radius of the projection 14 (the peak width w of the projection 14) formed on the sapphire substrate 11 is small, an outer shape of the peak portion (tip) of the projection 14 can be precisely measured.

Figure 7:
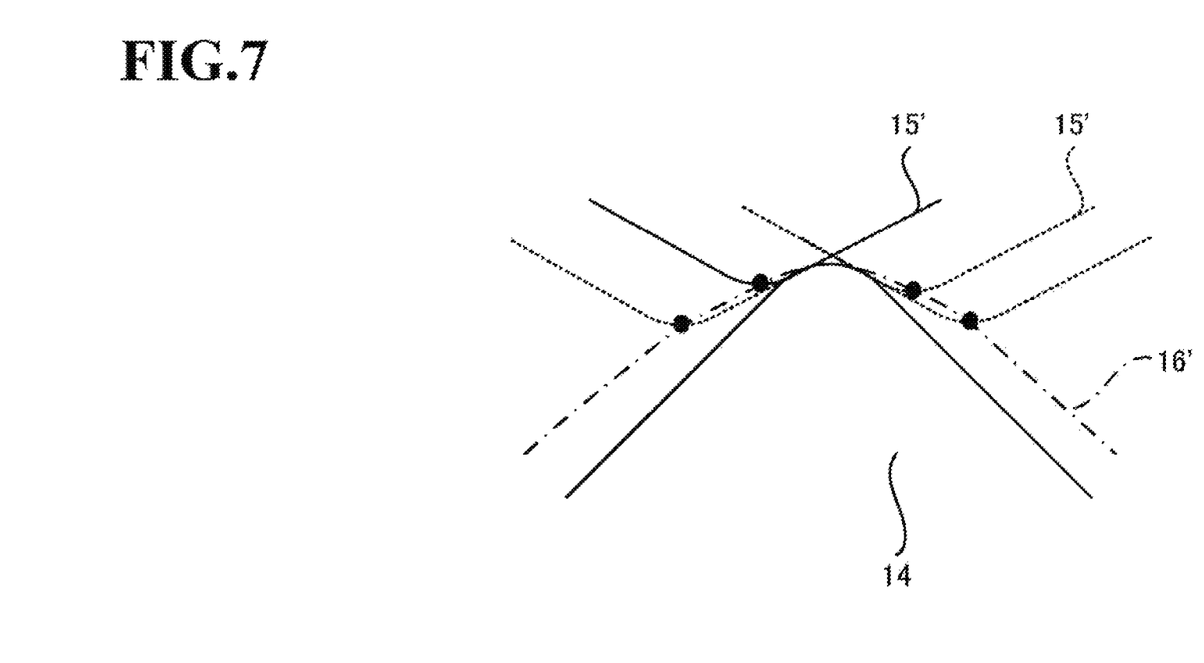
FIG. 7 is a schematic view showing a conventional method for measuring the shape of the projection by AFM measurement.

On the other hand, in a conventional AFM measurement or an SEM (Scanning Electron Microscope) measurement, there are cases in which detection at nm level is sometimes difficult, so the outer shape of the peak portion of the projection 14 cannot be precisely measured in some cases. For example, in AFM measurement, the curvature radius of the tip of the probe is usually several hundred nm in many cases. Therefore, as shown in FIG. 7, in the AFM measurement, for example when trying to measure the peak portion of the projection 14 having the curvature radius of about several hundred nm or less, an outline 16' reflecting the tip shape of the probe 15' as indicated by a dot-and-dash line in FIG. 7 is observed, which is larger than an actual outer shape of the projection 14 indicated by a solid line in FIG. 7. In the SEM measurement, it is originally difficult to obtain a cross-section passing through the peak of the projection 14 of the sapphire substrate 11.

As shown in FIG. 1, the nitride semiconductor layer 13 having a predetermined thickness (for example, 4 μm) is grown and formed on the buffer layer 12. Namely, the nitride semiconductor layer 13 is grown on the buffer layer 12 until its surface becomes flat. As the nitride semiconductor layer 13, for example a gallium nitride (GaN) layer, a gallium aluminum nitride (AlGaN) layer, an indium aluminum gallium nitride (InAlGaN) layer, or the like may be grown.

The buffer layer 12 and the nitride semiconductor layer 13 are preferably grown and formed on the sapphire substrate 11 by a vapor phase growth method. As the vapor phase growth method, for example a hydride vapor phase epitaxy (HVPE) method and a metal-organic vapor phase epitaxy (MOVPE) method, can be used. Alternatively, a molecular beam epitaxy (MBE) method can be used. Particularly, in the HVPE method, a growth rate for growing a crystal on the sapphire substrate 11 is fast, and therefore when the HVPE method is used, the time required for manufacturing the nitride semiconductor template 10 can be shortened. Accordingly, a manufacturing cost can be reduced.

Figure 4:
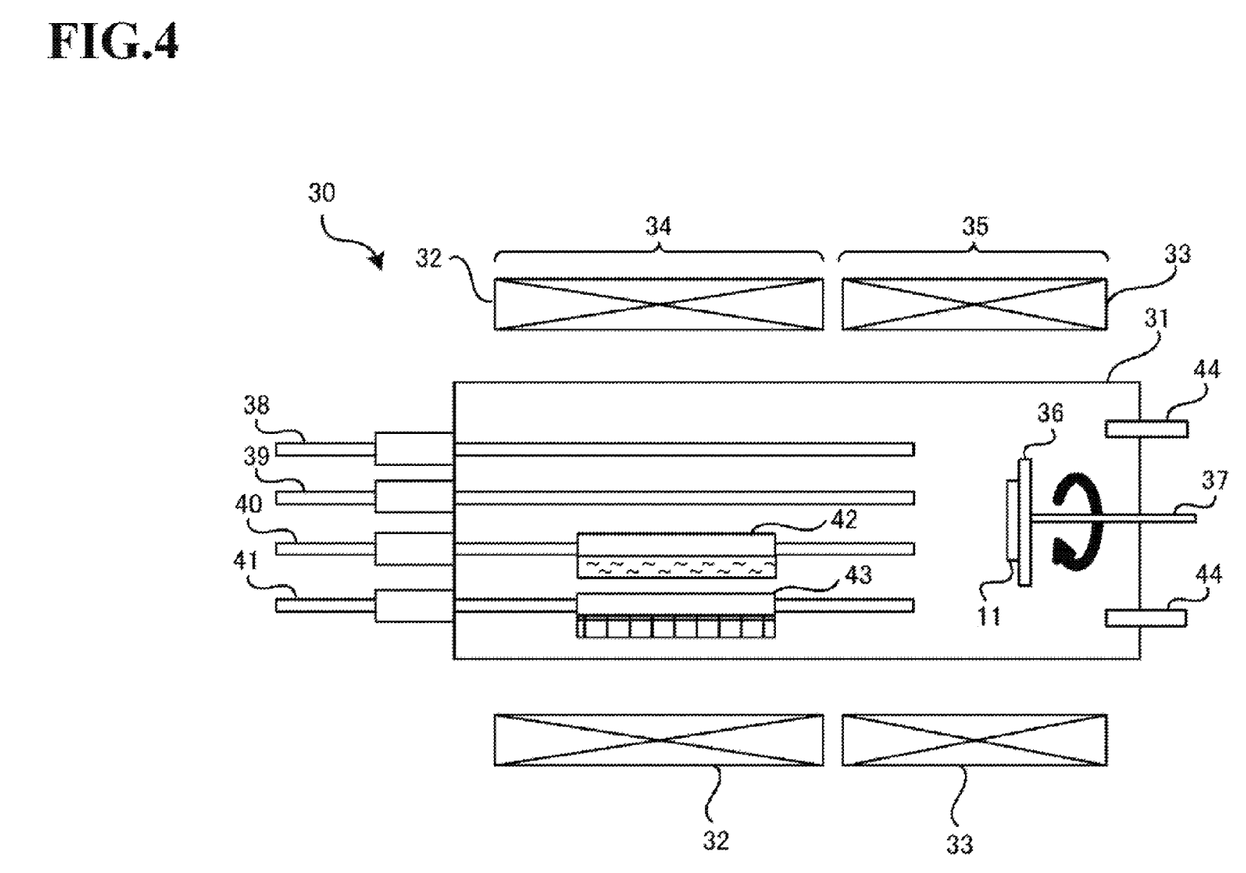
FIG. 4 is a schematic configuration view of a hydride vapor phase epitaxy device suitably used in an embodiment of the present invention.

Here, a hydride vapor phase epitaxy device (HVPE device) 30 for growing and forming the buffer layer 12 and the nitride semiconductor layer 13 on the sapphire substrate 11, will be described with reference to FIG. 4. FIG. 4 shows a schematic configuration view of the HVPE device 30.

As shown in FIG. 4, the HVPE device 30 includes a reaction furnace 31 made of, for example quartz or the like. A first heater 32 and a second heater 33 for heating an inside of the reaction furnace 31 are provided on an outer periphery of the reaction furnace 31. A region inside of the reaction furnace 31 heated mainly by the first heater 32 functions as a source section 34 and a region inside of the reaction furnace 31 heated mainly by the second heater 33 functions as a growth section 35. The source section 34 is heated to, for example 600° C. to 900° C. by the first heater 32 and is a space for reacting a reactive gas described later with gallium (Ga) or aluminum (Al) to generate a source gas. Further, the growth section 35 is heated to, for example about 500° C. to 1200° C. by the second heater 33, and is a space for reacting a group III source gas supplied into the reaction furnace 31 from a first group III source gas supply pipe 40 or a second group III source gas supply pipe 41 described later, and a group V source gas supplied into the reaction furnace 31 from a group V source gas supply pipe 39 described later, so that for example a GaN layer is grown on the sapphire substrate 11 as the nitride semiconductor layer 13. A heating temperature by the second heater 33 is a growth temperature.

A susceptor 36 as a substrate supporting part for supporting the sapphire substrate 11 in the reaction furnace 31 is provided in the growth section 35 in the reaction furnace 31. The sapphire substrate 11 is supported on the susceptor 36 so that a growth plane faces a gas supply port. The susceptor 36 is made of for example carbon, and its surface is covered with silicon carbide (SiC). The susceptor 36 includes a rotating shaft 37 made of, for example high-purity quartz. The sapphire substrate 11 and the susceptor 36 are configured to rotate at a predetermined speed (for example, 3 r/min to 100 r/min) by rotating the rotating shaft 37.

In the reaction furnace 31, a doping gas supply pipe 38, the group V source gas supply pipe 39, the first group III source gas supply pipe 40, and the second group III source gas supply pipe 41 are respectively installed. The doping gas supply pipe 38, the group V source gas supply pipe 39, the first group III source gas supply pipe 40, and the second group III source gas supply pipe 41 are respectively made of, for example high-purity quartz, and are provided with valves (not shown) for supplying and stopping a gas to the reaction furnace 31 respectively.

A doping gas supply source (not shown) is connected to an upstream side of the doping gas supply pipe 38. For example dichlorosilane ($SiH_2Cl_2$) gas diluted to a predetermined concentration (for example, 100 ppm) with for example nitrogen ($N_2$) gas, hydrogen ($H_2$) gas, a mixed gas of $N_2$ gas and $H_2$ gas, or the like, is supplied to the growth section 35 in the reaction furnace 31 as a doping gas from the doping gas supply pipe 38. For example, $SiHCl_3$ gas, $SiH_3Cl$ gas, and $SiCl_4$ gas may be used as the Si doping source gas, other than dichlorosilane ($SiH_2Cl_2$) gas.

When doping is not performed, for example $H_2$ gas, $N_2$ gas, or a mixed gas of $H_2$ gas and $N_2$ gas may be supplied into the reaction furnace 31 from the doping gas supply pipe 38. Further, for example HCl gas, $H_2$ gas, $N_2$ gas or the like may be supplied into the reaction furnace 31 from the doping gas supply pipe 38 as a cleaning gas for removing deposits or the like which are adhered to an inside of the reaction furnace 31 after growing for example the nitride semiconductor layer 13 on the sapphire substrate 11.

A group V source gas supply source (not shown) is connected to an upstream side of the group V source gas supply pipe 39. For example ammonia ($NH_3$) gas or the like is supplied to the growth section 35 in the reaction furnace 31 as the group V source gas from the V group source gas supply pipe 39.

For example, $H_2$ gas, $N_2$ gas, or a mixed gas thereof may be supplied as a carrier gas from the group V source gas supply pipe 39 together with the group V source gas. Only the carrier gas may be supplied into the reaction furnace 31 from the group V source gas supply pipe 39.

A Ga tank 42 storing Ga (melt) is installed in the source section 34 in the reaction furnace 31 of the first group III source gas supply pipe 40, and a reactive gas supply source (not shown) is connected to an upstream side of the first group III source gas supply pipe 40. The Ga tank 42 is preferably made of for example high-purity quartz. First, for example hydrogen chloride (HCl) gas is supplied into the Ga tank 42 as the reactive gas from the first group III source gas supply pipe 40. GaCl gas which is a group III source gas is generated by supplying the reactive gas into the Ga tank 42. Then, GaCl gas is supplied to the growth section 35 in the reaction furnace 31 from the first group III source gas supply pipe 40.

For example $H_2$ gas, $N_2$ gas, or a mixed gas thereof may be supplied as a carrier gas from the first group III source gas supply pipe 40 together with the group III source gas.

An Al tank 43 storing Al (solid) is installed in the source section 34 in the reaction furnace 31 of the second group III source gas supply pipe 41, and a reactive gas supply source (not shown) is connected to an upstream side of the second group III source gas supply pipe 41. The Al tank 43 is preferably made of for example high-purity quartz. First, for example HCl gas is supplied into the Al tank 43 as the reactive gas from the second group III source gas supply pipe 41. AlCl gas which is the group III source gas is generated by supplying the reactive gas into the Al tank 43. Then, AlCl gas is supplied to the growth section 35 in the reaction furnace 31 from the second group III source gas supply pipe 41.

For example $H_2$ gas, $N_2$ gas, or a mixed gas thereof may be supplied as a carrier gas from the second group III source gas supply pipe 41 together with the group III source gas.

An exhaust pipe 44 is connected to a downstream side of the growth section 35 of the reaction furnace 31. The exhaust pipe 44 is configured to discharge the gas inside of the reaction furnace 31 to the outside of the reaction furnace 31.

By using such an HVPE device 30, it is possible to form the buffer layer 12 and the nitride semiconductor layer 13 on the sapphire substrate 11 by hydride vapor phase epitaxy. Thereby, the growth rate of the nitride semiconductor can be increased.

(2) Method for Manufacturing a Nitride Semiconductor Template

Next, a method for manufacturing the nitride semiconductor template 10 according to an embodiment of the present invention will be described. In this embodiment, a case where the nitride semiconductor template 10 is manufactured using for example a HVPE device 30 shown in FIG. 4, will be described.

(Projection Forming Step)

In the method for manufacturing the nitride semiconductor template 10 according to this embodiment, first, for example the sapphire substrate 11 having a flat surface is prepared. Then, uneven processing is applied to the sapphire substrate 1, so that predetermined projections 14 are formed to be arranged in a lattice pattern on the surface, which is the growth plane, of the sapphire substrate 11 on which the buffer layer 12 is grown.

The projections 14 are formed by, for example photolithography and dry-etching. Namely, first, a photoresist pattern is formed on the surface of the sapphire substrate 11. As an example, a photoresist is applied on an entire surface of a mirror-polished C-plane sapphire substrate, and thereafter pattern exposure and development are performed by photolithography, to thereby form a photoresist pattern in which columnar photoresists are arranged in a lattice pattern on the surface. Next, the sapphire substrate 11 on which the abovementioned photoresist pattern is formed, is baked using a hot plate to heat the photoresist. In this baking step, an extra organic solvent in the photoresist is evaporated, and the columnar photoresist changes to a hemispherical photoresist. Next, dry-etching is applied to the surface of the sapphire substrate 11 on which the hemispherical photoresist is formed. As an example, the dry-etching step includes: using a plasma etching device, installing the sapphire substrate 11 in a reaction chamber of the plasma etching device, supplying a reactive gas containing chlorine into the reaction chamber, utilizing reactive gas plasma generated in the reaction chamber, to thereby apply dry-etching to the surface of the sapphire substrate 11. By this dry-etching, conical projections 14 are formed to be arranged in a lattice pattern on the surface of the sapphire substrate 11. The curvature radius or the peak width w of the projection 14 formed on the sapphire substrate 11 can be changed by changing the condition of photolithography and dry-etching, such as etching time for example.

(Projection Peak Width Calculating Step)

When the projection forming step is ended, the outer shape of the projection 14 is measured by AFM, and the peak width w of the projection 14 is calculated (measured) from the measurement result of the outer shape of the projection 14.

Namely, first, as shown in FIG. 3, using the probe 15 whose tip curvature radius is small, the probe 15 is moved along at least one projection 14. Then, the outer shape (outline 16) of the cross-section including the peak of the projection 14 is measured by reading and plotting the position information of the probe 15 at a plurality of locations on the projection 14. It is preferable to use a probe whose tip is sharpened by etching so as to have a curvature radius of about 10 nm, or a probe made of a carbon nanotube having a diameter of about 1 nm, as the probe 15. Thereby, even when the curvature radius of the projection 14 formed on the sapphire substrate 11 is small, a shape of the peak portion (tip) of the projection 14 can be precisely measured.

After the outer shape (outline 16) of the projection 14 is measured, as shown in FIG. 2, the height h of the projection 14 is calculated from the measured outer shape (outline 16). Then, two tangent lines $L_1$ and $L_2$ having a tangent point at a position (h/2) which is half of the height h of the projection 14 are obtained, and intersection $T_3$ of the two tangent lines $L_1$ and $L_2$ is obtained. Next, top point $T_0$ of the outline 16 of the projection 14 is detected, and the parallel line $L_3$ which is in contact with top point $T_0$ and is parallel to the surface 11a of the sapphire substrate 11 on which the projections 14 are not formed, is obtained. Then, the length of the base $T_1T_2$ of the triangle $T_1T_2T_3$ formed by two tangent lines $L_1$ and $L_2$ and the parallel line $L_3$, is obtained. The length of this base $T_1T_2$ is defined as the peak width w of the projection 14.

(Substrate Loading Step)

When the projection peak width calculating step is ended, the sapphire substrate 11 on which the projections 14 are formed, is loaded into the reaction furnace 31 and placed on the susceptor 36.

(Buffer Layer Forming Step)

An AlN layer having a thickness of not more than the peak width w of the projection 14 calculated in the abovementioned projection peak width calculating step and having a thickness of not less than 10 nm and not more than 330 nm, is grown and formed as the buffer layer 12 on the surface of the sapphire substrate 11 on which the projections 14 are formed. At this time, the buffer layer 12 may be grown and formed under a growth condition such that the thickness of the flat buffer layer in the case of being formed on a flat sapphire substrate on which the projections 14 are not formed, is not more than the peak width w of the projection 14, and is not less than 10 nm and not more than 330 nm.

As a result thereof, it is possible to suppress the following situation: the buffer layer 12 is formed to be thicker at the peak portion of the projection 14 than other portions, and the buffer layer 12 is formed into a sharp pointed shape at the peak portion of the projection 14. Thereby, it is possible to suppress the generation of the inversion domain (ID) in the buffer layer 12 in an upper part of the position located on the peak or near the peak of the projection 14. Thereby, it is possible to suppress the generation of ID in the nitride semiconductor layer 13 in the upper part of the peak or near the peak of the projection 14. As a result, it is possible to suppress the occurrence of the surface pits on the surface of the nitride semiconductor layer 13, that is, on the surface of the nitride semiconductor template 10.

Namely, first, the sapphire substrate 11 is heated to a predetermined temperature (for example, 600° C. or less, or 1000° C. or more) by the second heater 33, and the source section 34 of the reaction furnace 31 is heated by the first heater 32. When the temperature of the sapphire substrate 11 reaches a predetermined temperature and the temperature of the source section 34 of the reaction furnace 31 reaches a predetermined temperature, supply of HCl gas as a reactive gas is started into the second group III source gas supply pipe 41, HCl gas is supplied into the Al tank 43, and generation of AlCl gas is started, while exhausting it from the exhaust pipe 44. Then, AlCl gas is supplied into the reaction furnace 31 from the second group III source gas supply pipe 41. Simultaneously with supply of AlCl gas into the reaction furnace 31, $NH_3$ gas is supplied into the reaction furnace 31 as the group V source gas from the group V source gas supply pipe 39. At this time, for example $H_2$ gas, $N_2$ gas may be supplied as a carrier gas to the second group III source gas supply pipe 41 and the group V source gas supply pipe 39. Then, AlCl gas as the group III source gas and $NH_3$ gas as the group V source gas are reacted in the growth section 35 in the reaction furnace 31, so that the AlN layer as the buffer layer 12 having a predetermined thickness is grown and formed on the sapphire substrate 11. When the thickness of the AlN layer as the buffer layer 12 reaches a predetermined thickness, supply of AlCl gas and $NH_3$ gas into the reaction furnace 31 is stopped. Heating inside of the reaction furnace 31 by the first heater 32 and the second heater 33 is continued.

(Nitride Semiconductor Layer Forming Step)

When the buffer layer forming step is ended, a GaN layer having a predetermined thickness (for example, not less than 4 μm and not more than 50 μm) is grown and formed as the nitride semiconductor layer 13 on the AlN layer which is the buffer layer 12.

Namely, supply of HCl gas as a reactive gas is started into the first group III source gas supply pipe 40, HCl gas is supplied into the Ga tank 42, and generation of GaCl gas which is a group III source gas is started, while exhausting it from the exhaust pipe 44. Then, GaCl gas is supplied into the reaction furnace 31 from the first group III source gas supply pipe 40. Simultaneously with supply of GaCl gas into the reaction furnace 31, $NH_3$ gas which is the group V source gas is supplied into the reaction furnace 31 from the group V source gas supply pipe 39. At this time, for example $H_2$ gas, $N_2$ gas may be supplied as a carrier gas to the first group III source gas supply pipe 40 and the group V source gas supply pipe 39. Then, GaCl gas which is the group III source gas and $NH_3$ gas which is the group V source gas are reacted in the growth section 35 in the reaction furnace 31, so that the GaN layer as the nitride semiconductor layer 13 having a predetermined thickness which is an undoped layer to which a dopant is not added (doped), is formed on the sapphire substrate 11. When the thickness of the GaN layer reaches a predetermined thickness, supply of GaCl gas into the reaction furnace 31 is stopped.

Simultaneously with supply of GaCl gas and supply of $NH_3$ gas into the reaction furnace 31, for example a gas obtained by diluting $SiH_2Cl_2$ gas with nitrogen ($N_2$) gas or the like may be supplied from the doping gas supply pipe 38 as a doping gas. Namely, Si may be added (doped) as an impurity, while GaCl gas which is the group III source gas and $NH_3$ gas which is the group V source gas are reacted in the growth section 35 in the reaction furnace 31. In this case, Si-doped n-type GaN layer is formed as the nitride semiconductor layer 13. When the thickness of the n-type GaN layer reaches a predetermined thickness, supply of GaCl gas and supply of the doping gas into the reaction furnace 31, are stopped.

(Purge Step)

After supply of GaCl gas into the reaction furnace 31 is stopped, supply of an inert gas such as $N_2$ gas is started from at least one of the first group III source gas supply pipe 40 and the second group III source gas supply pipe 41. Thereby, the inside of the reaction furnace 31 is purged with $N_2$ gas to remove a residual gas and reaction products remaining in the reaction furnace 31. Further, the heating inside of the reaction furnace 31 by the first heater 32 and the second heater 33 is stopped while supply of the inert gas and $NH_3$ gas into the reaction furnace 31 is continued, and the temperature in the reaction furnace 31 and the temperature of the sapphire substrate 11 are lowered. After the temperature in the reaction furnace 31 is lowered to a temperature (for example, about 500° C.) at which the GaN layer formed on the sapphire substrate 11 is not re-evaporated, supply of $NH_3$ gas is stopped while supply of the inert gas into the reaction furnace 31 is continued. After the temperature in the reaction furnace 31 is lowered to near a room temperature, supply of the inert gas into the reaction furnace 31 is stopped.

(Substrate Unloading Step)

When the purge step is ended, the sapphire substrate 11 is detached from the susceptor 36, the sapphire substrate 11 is unloaded to outside of the reaction furnace 31, and the step of manufacturing the nitride semiconductor template 10 according to this embodiment is ended.

(3) Light-Emitting Element

Figure 5:
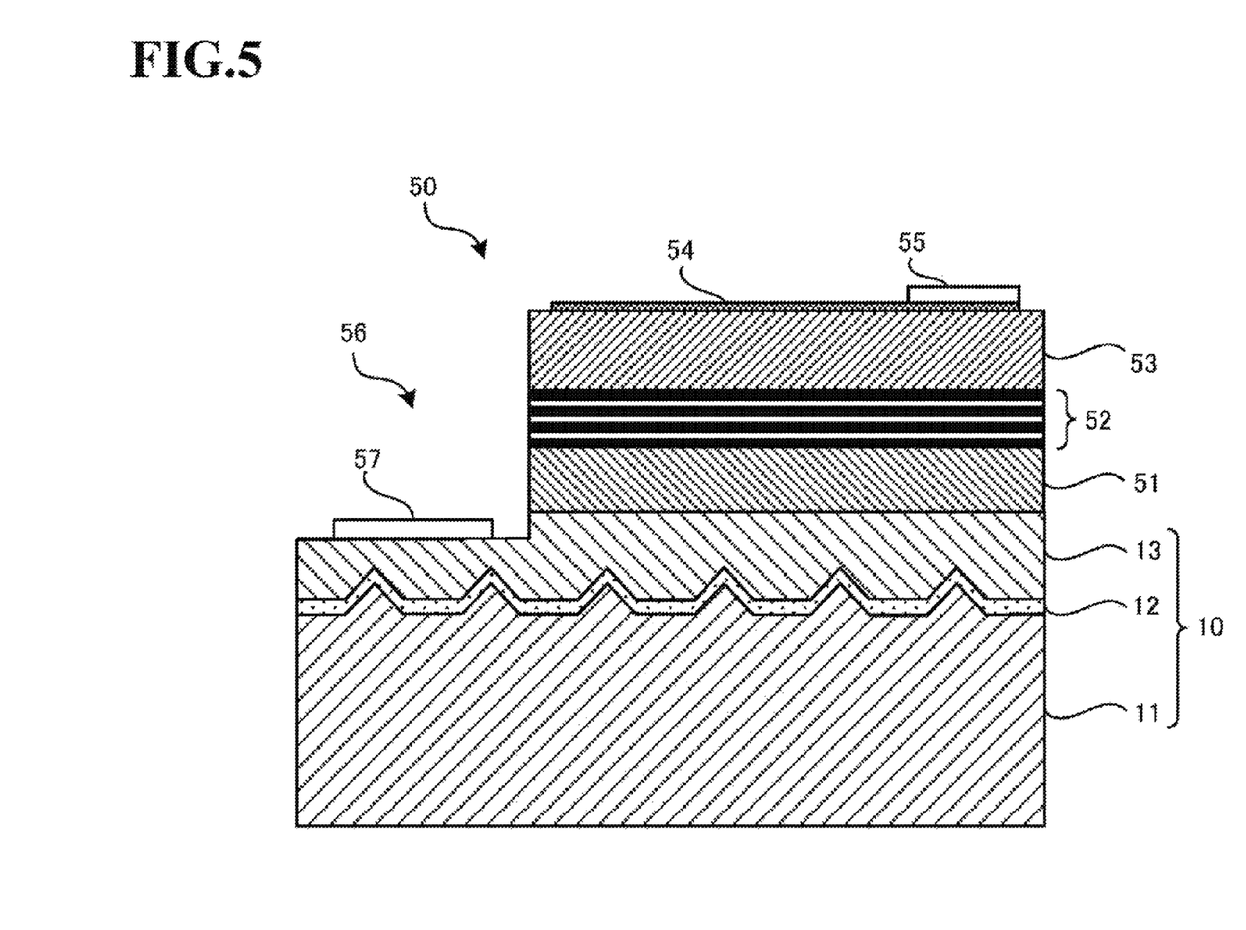
FIG. 5 is a schematic cross-sectional view of a light-emitting element according to an embodiment of the present invention.

Next, a light-emitting element 50 using the abovementioned nitride semiconductor template 10 will be described mainly with reference to FIG. 5. FIG. 5 is a schematic cross-sectional view of the light-emitting element 50 according to this embodiment.

As shown in FIG. 5, the light-emitting element 50 includes a light-emitting part on the nitride semiconductor template 10. Namely, the light-emitting element 50 is formed by growing an n-type semiconductor layer 51, a light-emitting layer 52, and a p-type semiconductor layer 53 in this order as a light-emitting part on the nitride semiconductor template 10.

For example an n-type GaN layer is grown and formed as the n-type semiconductor layer 51. The n-type semiconductor layer 51 may contain predetermined n-type impurities at a predetermined concentration. For example silicon (Si), selenium (Se), tellurium (Te), or the like can be used as the n-type impurities. The thickness of the n-type semiconductor layer 51 may be, for example about not less than 0.2 μm and not more than 15 μm.

The light-emitting layer 52 may be formed of a multiple quantum well (MQW) layer including barrier layers and well layers. Namely, the light-emitting layer 52 may have a multiple quantum well (MQW) structure in which for example an InGaN layer is a well layer, for example a GaN layer having a larger band gap than the well layer is a barrier layer, and the well layer and the barrier layer are alternately laminated one by one. The light-emitting layer 52 may have a single quantum well (SQW) structure. In addition, the light-emitting layer 52 is preferably composed of an undoped compound semiconductor to which impurities are not added. The thickness of the light-emitting layer 52 may be about several 100 nm.

For example a p-type AlGaN layer and/or a p-type GaN layer is gown and formed on the light-emitting layer 52 as the p-type semiconductor layer 53. For example the p-type AlGaN layer and the p-type GaN layer may be grown and formed in this order from a side of the light-emitting layer 52 as the p-type semiconductor layer 53. The p-type semiconductor layer 53 contains predetermined p-type impurities at a predetermined concentration. For example magnesium (Mg), zinc (Zn), carbon (C) or the like can be used as the p-type impurity. The thickness of the p-type semiconductor layer 53 is, for example not less than 200 nm and not more than 500 nm.

Various vapor phase growth methods can be used as the growth method for the n-type semiconductor layer 51, the light-emitting layer 52, and the p-type semiconductor layer 53. For example, a metal organic vapor phase epitaxy method (a MOVPE method), a molecular beam epitaxy method (a MBE method), and a hydride vapor phase epitaxy method (a HVPE method) can be used. Among them, when the MOVPE method is used, better crystallinity can be obtained.

A first electrode 54 is provided on the surface of the p-type semiconductor layer 53. The first electrode 54 is preferably formed by laminating, for example a nickel (Ni) layer and a gold (Au) layer in this order from a side of the p-type semiconductor layer 53.

An electrode pad 55 is formed on the first electrode 54. The electrode pad 55 is formed to be smaller than the first electrode 54. The electrode pad 55 may be formed in substantially the same shape as the first electrode 54. The electrode pad 55 is preferably formed by laminating, for example a titanium (Ti) layer and an Au layer in this order from a side of the first electrode 54. The electrode pad 55 is configured as, for example an electrode pad for wire bonding.

An exposure region 56 for exposing the surface of the nitride semiconductor template 10, that is, the nitride semiconductor layer 13, is formed in the light-emitting part. A second electrode 57 is provided in the exposure region 56. The second electrode 57 is preferably formed by laminating, for example a Ti layer and an aluminum (Al) layer in this order from a side of the n-type nitride semiconductor layer 13. The second electrode 57 is configured as, for example an electrode for die bonding.

(4) Method for Manufacturing a Light-Emitting Element

Next, a method for manufacturing the light-emitting element according to this embodiment will be described.

(Light-Emitting Part Forming Step)

The light-emitting part is grown and formed on the nitride semiconductor template 10. Namely, first, for example an n-type GaN layer is formed as the n-type semiconductor layer 51 on the surface of the nitride semiconductor layer 13, next an MQW layer composed of an InGaN layer of the well layer and a GaN layer of the barrier layer is formed as the light-emitting layer 52 on the n-type semiconductor layer 51, then for example a p-type AlGaN layer and a p-type GaN layer are formed as a p-type semiconductor layer 53 on the light-emitting layer 52 in this order from the side of the light-emitting layer 52, for example by the MOVPE method.

(Exposure Region Forming Step)

Next, the exposure region 56 for exposing the nitride semiconductor template 10 (nitride semiconductor layer 13) is formed in the light-emitting part which is formed on the nitride semiconductor template 10. Namely, for example, a resist pattern is formed at a predetermined position on an upper surface of the light-emitting part, that is, on the upper surface of the p-type semiconductor layer 53. Subsequently, the p-type semiconductor layer 53, the light-emitting layer 52, and the n-type semiconductor layer 51 are partially removed by etching (for example, RIE (Reactive Ion Etching)), using the resist pattern as a mask. The p-type semiconductor layer 53, the light-emitting layer 52, and the n-type semiconductor layer 51 may be etched simultaneously or separately. Thereby, the exposure region 56 where the nitride semiconductor template 10 is exposed, is formed at a predetermined position of the light-emitting part. Further, as shown in FIG. 5, etching is also applied to a predetermined position of the nitride semiconductor layer 13 included in the nitride semiconductor template 10 in addition to the p-type semiconductor layer 53, the light-emitting layer 52 and the n-type semiconductor layer 51, so that a recessed portion of a predetermined depth may be provided in the exposure region 56.

(First Electrode Forming Step)

Next, the first electrode 54 is formed in a part of the upper surface of the p-type semiconductor layer 53. Specifically, a resist pattern of a predetermined shape is formed on the p-type semiconductor layer 53 by, for example a photolithography method. Subsequently, for example Ni and Au are deposited in this order by a vacuum evaporation method, a sputtering method, or the like, and then the resist pattern is removed by a lift-off method. As a result thereof, the first electrode 54 having a predetermined shape is formed on a part of the upper surface of the p-type semiconductor layer 53.

Subsequently, for example Ti and Au are deposited in this order on the first electrode 54 by, for example a photolithography method, and a lift-off method using a vacuum evaporation method, a sputtering method, or the like, to thereby form the electrode pad 55.

(Second Electrode Forming Step)

Next, the second electrode 57 is formed in a part of the nitride semiconductor template 10 (namely, the nitride semiconductor layer 13) exposed from the exposure region 56. Specifically, a resist pattern having a predetermined shape is formed on the nitride semiconductor layer 13 exposed from the exposure region 56 by, for example a photolithography method. Subsequently, for example Ti and Al are deposited in this order by a vacuum evaporation method, a sputtering method, or the like, and then the resist pattern is removed by a lift-off method. Thereby, the second electrode 57 having a predetermined shape is formed in a part of the nitride semiconductor layer 13 exposed from the exposure region 56.

Thereafter, the light-emitting element 50 according to this embodiment is obtained by performing chipping or the like.

(5) Effect of this Embodiment

According to this embodiment, one or more of the following effects are exhibited.

According to this embodiment, the nitride semiconductor template 10 includes the sapphire substrate 11 formed by arranging the conical or pyramidal projections 14 on its surface in a lattice pattern, the buffer layer 12, and the nitride semiconductor layer 13. The buffer layer 12 is formed in a thickness of not more than the peak width w of the projection 14, and in a thickness of not less than 10 nm and not more than 330 nm. Alternatively, the buffer layer 12 is grown and formed under the growth condition such that the thickness of the flat buffer layer is not more than the peak width w of the projection 14 and is less than 10 nm and not more than 330 nm. As a result thereof, generation of ID and occurrence of the surface pits in the nitride semiconductor layer 13 of the nitride semiconductor template 10 can be suppressed.

When the buffer layer 12 is formed in a thickness of not more than the peak width w of the projection 14, or when the buffer layer 12 is formed under the growth condition such that the thickness of the flat buffer layer is not more than the peak width w of the projection 14, the buffer layer 12 is prevented from being formed into a sharp pointed shape at the peak portion of the projection 14. Thereby, it is possible to suppress the generation of ID and the occurrence of the surface pits in the nitride semiconductor layer 13 in the upper part of the position located on the peak or near the peak of the projection 14.

By forming the buffer layer 12 in a thickness of not less than 10 nm and not more than 330 nm, or by growing and forming the buffer layer 12 under the growth condition such that the thickness of the flat buffer layer is not less than 10 nm and not more than 330 nm, an effect of suppressing lowering of the coverage by the buffer layer 12 and deterioration of the crystal quality of the buffer layer 12, and suppressing generation of ID and occurrence of the surface pits, can be obtained.

Other Embodiment

As described above, an embodiment of the present invention has been specifically described. However, the present invention is not limited to the abovementioned embodiment, and can be variously modified in a range not departing from the gist of the invention.

In the abovementioned embodiment, the nitride semiconductor template 10 is formed by growing the buffer layer 12 and the nitride semiconductor layer 13 in this order on the sapphire substrate 11 by the HVPE method. However, the present invention is not limited thereto. In addition, the buffer layer 12 and the nitride semiconductor layer 13 may be grown on the sapphire substrate 11 by the MOVPE method. Thereby, the crystallinity of the buffer layer 12 and the nitride semiconductor layer 13 can be further improved.

EXAMPLES

Next, examples of the present invention will be described. However, the present invention is not limited to these examples.

(Fabrication of a Sample)

In this example, conical projections 14 were formed to be arranged in a triangular lattice pattern by photolithography and dry-etching on the surface of mirror-polished C-plane sapphire substrate having a thickness of 900 µm and a diameter of 100 mm (4 inches). The shape and the size of the projection 14 were adjusted by changing the condition of photolithography and dry-etching. Further, various sapphire substrates 11 having the peak width w of the projection 14 in a range of 5 nm to 870 nm were fabricated by adjusting the peak width w of the projection 14, particularly by changing the etching time for dry-etching.

Next, the buffer layer 12 made of AlN was formed using the HVPE device 30 shown in FIG. 4 on the abovementioned sapphire substrate 11 having various peak widths w, under the growth condition such that the thickness of the flat buffer layer is 2 nm to 600 nm. The thickness of the flat buffer layer is the thickness of the buffer layer formed on the flat sapphire substrate on which the projections 14 are not formed. Then, the nitride semiconductor layer 13 made of GaN having a predetermined thickness (4 μm) was grown on the buffer layer 12 made of AlN, to thereby fabricate the nitride semiconductor template 10.

Namely, first, the sapphire substrate 11 is placed on the susceptor 36. Then, the rotating shaft 37 is rotated to start the rotation of the susceptor 36. Subsequently, the source section 34 in the reaction furnace 31 is heated to about 850° C. by the first heater 32 and the sapphire substrate 11 (the growth section 35 in the reaction furnace 31) is heated to about 1000° C. by the second heater 33 for 10 minutes, while supplying a mixed gas of 3 sml of hydrogen ($H_2$) gas and 7 sml of nitrogen ($N_2$) gas into the reaction furnace 31, from the doping gas supply pipe 38, the group V source gas supply pipe 39, the first group III source gas supply pipe 40, or the second group III source gas supply pipe 41. At this time, the pressure inside of the reaction furnace 31 was set to a normal pressure (1 atm).

When the temperature of the sapphire substrate 11 reached a predetermined temperature (for example, 1000° C.), 50 sccm of hydrogen chloride (HCl) gas was supplied into the Al tank 43 from the second group III source gas supply pipe 41, so that AlCl gas which is the group III source gas is generated. Then AlCl gas was supplied into the reaction furnace 31. 2 slm of $H_2$ gas and 1 slm of $N_2$ gas were flowed into the second group III source gas supply pipe 41 as a carrier gas together with HCl gas. Simultaneously with supply of AlCl gas into the reaction furnace 31 from the second group III source gas supply pipe 41, 50 sccm of ammonia ($NH_3$) gas was supplied into the reaction furnace 31 as the group V source gas from the V group source gas supply pipe 39. 1 slm of $H_2$ gas was flowed into the group V source gas supply pipe 39 as a carrier gas together with $NH_3$ gas. Then, AlCl gas which is the group III source gas and $NH_3$ gas which is the group V source gas were reacted in the growth section 35 in the reaction furnace 31, so that an AlN layer was grown on the sapphire substrate 11. The growth time of the AlN layer was set to 1 second to 300 seconds. Thereby, the buffer layer 12 made of AlN having various thicknesses was grown and formed on the sapphire substrate 11, under the growth condition such that the thickness of the flat buffer layer was 2 nm to 600 nm.

Next, the nitride semiconductor layer 13 made of GaN was grown and formed on the AlN layer as the buffer layer 12. 50 sccm of HCl gas was supplied into the Ga tank 42 from the first group III source gas supply pipe 40, so that GaCl gas which is the group III source gas is generated. Then, GaCl gas was supplied into the reaction furnace 31. 2 slm of $H_2$ gas and 1 slm of $N_2$ gas were flowed into the first group III source gas supply pipe 40 as a carrier gas together with HCl gas. Simultaneously with supply of GaCl gas into the reaction furnace 31 from the first group III source gas supply pipe 40, 2 slm of ammonia ($NH_3$) gas was supplied into the reaction furnace 31 as the group V source gas from the group V source gas supply pipe 39. 1 slm of $H_2$ gas was flowed into the group V source gas supply pipe 39 as a carrier gas together with $NH_3$ gas. Then, GaCl gas which is the group III source gas and $NH_3$ gas which is the group V source gas were reacted in the growth section 35 in the reaction furnace 31, so that a GaN layer having a predetermined thickness (4 μm) was grown on the AlN layer, as the nitride semiconductor layer 13. The growth time of the GaN layer was set to 6 minutes.

Thereafter, the heating inside of the reaction furnace 31 by the first heater 32 and the second heater 33 was stopped. Then, the temperature of the sapphire substrate 11 is lowered to around a room temperature, while supplying 2 slm of $NH_3$ gas and 8 slm of $N_2$ gas into the reaction furnace 31, for example from the V group source gas supply pipe 39, to thereby obtain various nitride semiconductor templates 10, which were used as various samples.

Namely, various samples were fabricated by variously changing the peak width w of the projection 14 and the thickness of the flat buffer layer as shown in table 1.

(Evaluation of the Samples)

For these various samples, whether or not the surface pits occur, was evaluated. Then, samples in which the number of pits confirmed in an arbitrary 10 mm square region was 0, were evaluated as "⊚", and samples in which the number of pits confirmed in an arbitrary 10 mm square region was 1 or 2, were evaluated as "○", samples in which the number of pits confirmed in an arbitrary 10 mm square region was 3 or more, were evaluated as "×", and evaluation results of each sample are shown in table 1.

TABLE 1

| | | Thickness of flat buffer layer (nm) | | | | | | | | | | | | | |
|---|---|---|---|---|---|---|---|---|---|---|---|---|---|---|---|
| | | 2 | 4 | 10 | 45 | 65 | 105 | 120 | 144 | 150 | 180 | 200 | 330 | 430 | 520 | 600 |
| Peak width of projection (nm) | 5 | X | X | X | X | X | X | X | X | X | X | X | X | X | X | X |
| | 10 | X | X | ○ | X | X | X | X | X | X | X | X | X | X | X | X |
| | 45 | X | X | ○ | ○ | X | X | X | X | X | X | X | X | X | X | X |
| | 72 | X | X | ○ | ⊚ | ○ | X | X | X | X | X | X | X | X | X | X |
| | 120 | X | X | ○ | ⊚ | ⊚ | ○ | ○ | X | X | X | X | X | X | X | X |
| | 150 | X | X | ○ | ⊚ | ⊚ | ⊚ | ⊚ | ○ | X | X | X | X | X | X | X |
| | 168 | X | X | ○ | ○ | ⊚ | ⊚ | ⊚ | ○ | ○ | X | X | X | X | X | X |
| | 211 | X | X | ○ | ○ | ⊚ | ⊚ | ⊚ | ⊚ | ⊚ | ○ | ○ | X | X | X | X |
| | 346 | X | X | ○ | ○ | ○ | ○ | ○ | ○ | ⊚ | ⊚ | ⊚ | ○ | X | X | X |
| | 520 | X | X | X | X | X | X | X | X | X | X | X | X | X | X | X |
| | 870 | X | X | X | X | X | X | X | X | X | X | X | X | X | X | X | and $NH_3$ gas which is the group V source gas were reacted in the growth section 35 in the reaction furnace 31, so that an AlN layer was grown on the sapphire substrate 11. The It was confirmed from table 1, that occurrence of the surface pits is suppressed in the nitride semiconductor template 10 which is the sample on which the buffer layer 12 is grown and formed on the sapphire substrate 11 on which the projections 14 are formed, under the growth condition such that the thickness of the flat buffer layer formed on the flat substrate is not more than the peak width w of the projection 14, and is not less than 10 nm and not more than 330 nm.

Further, the light-emitting part was formed on the nitride semiconductor template 10 corresponding to various samples fabricated as described above, to thereby fabricate various LEDs. Then, a current of 20 mA was applied to the various LEDs, and light emission outputs of the LEDs were measured and evaluated. As a result, it was found that the light emission output of the LED fabricated using the nitride semiconductor template in which occurrence of surface pits is suppressed, that is, a nitride semiconductor template whose evaluation in table 1 was "⊚" or "◯", was about the same as the light emission output of the LED formed by the MOVPE method. Namely, it was confirmed that even in a case of the LED fabricated using the nitride semiconductor template 10 by growing and forming the buffer layer 12 and the nitride semiconductor layer 13 on the sapphire substrate 11 by the HVPE method, the light emission output about the same as that of the LED fabricated by the MOVPE method could be obtained. The LED fabricated by the MOVPE method is the LED fabricated by continuously forming the light-emitting part on the nitride semiconductor template 10 after the nitride semiconductor template 10 is fabricated by growing and forming the buffer layer 12 and the nitride semiconductor layer 13 on the sapphire substrate 11 by the MOVPE method. In contrast, the light emission output of the LED fabricated using the nitride semiconductor template in which the surface pits occurred, that is, the nitride semiconductor template whose evaluation in table 1 was "×", was less than half of the light emission output of the LED fabricated by the MOVPE method.

Further, for each of the various LEDs fabricated using the nitride semiconductor template 10 fabricated by the HVPE method and the LED fabricated by the MOVPE method, a reduction rate of the light emission output was calculated and evaluated. Namely, a current of 60 mA is applied to the various LEDs, and the LED fabricated by the MOVPE method respectively, and the light emission output at a start of energization and the light emission output after energization for 1000 hours were measured, and the reduction rate of the light emission output after energization for 1000 hours was calculated. As a result, it was confirmed that the reduction rate of the light emission output of the LEDs fabricated using the nitride semiconductor template 10 whose evaluation in table 1 was "◯", was about 10%, which was about the same as the reduction rate of the light emission output of the LED fabricated by the MOVPE method. It was also confirmed that the reduction rate of the light emission output of the LEDs fabricated using the nitride semiconductor template 10 whose evaluation in table 1 was "⊚", was 5% or less, which was lower than the reduction rate of the light emission output of the LED fabricated by the MOVPE method.

DESCRIPTION OF SIGNS AND NUMERALS

10 Nitride semiconductor template
11 Sapphire substrate
11a Surface of the sapphire substrate
13 Nitride semiconductor layer
14 Projection
w Peak width of the projection

The invention claimed is:

1. A method for manufacturing a nitride semiconductor template, comprising the steps of:
    growing and forming a buffer layer in a thickness of not more than a peak width of a projection and in a thickness of not less than 10 nm and not more than 330 nm on a sapphire substrate formed by arranging conical or pyramidal projections on its surface in a lattice pattern; and
    growing and forming a nitride semiconductor layer on the buffer layer.

2. The method for manufacturing a nitride semiconductor template according to claim 1, wherein in the step of growing and forming the buffer layer, a GaN layer or an AlN layer is grown as the buffer layer at a temperature of 600° C. or less.

3. The method for manufacturing a nitride semiconductor template according to claim 1, wherein in the step of growing and forming the buffer layer, an AlN layer is grown as the buffer layer at a temperature of 1000° C. or more.

4. The method for manufacturing a nitride semiconductor template according to claim 1, wherein in the step of growing and forming the nitride semiconductor layer, any one of a GaN layer, an AlGaN layer, and an InAlGaN layer is grown and formed as the nitride semiconductor layer.

5. The method for manufacturing a nitride semiconductor template according to claim 1, wherein the buffer layer and the nitride semiconductor layer are grown by a HVPE method or a MOVPE method.

* * * * *